United States Patent
Sato

(10) Patent No.: US 8,107,899 B2
(45) Date of Patent: Jan. 31, 2012

(54) POWER SUPPLY CIRCUIT

(75) Inventor: Yuji Sato, Miyagi (JP)

(73) Assignee: Panasonic Corporation, Osaka (JP)

( * ) Notice: Subject to any disclaimer, the term of this patent is extended or adjusted under 35 U.S.C. 154(b) by 916 days.

(21) Appl. No.: 12/105,724

(22) Filed: Apr. 18, 2008

(65) Prior Publication Data

US 2008/0261542 A1 Oct. 23, 2008

(30) Foreign Application Priority Data

Apr. 19, 2007 (JP) ................................ 2007-110684

(51) Int. Cl.
H03C 3/00 (2006.01)
H04B 1/68 (2006.01)

(52) U.S. Cl. .................... 455/109; 455/114.3; 455/127.1

(58) Field of Classification Search .................. 455/102, 455/108–110, 114.2–114.3, 115.1–115.4, 455/127.1–127.5
See application file for complete search history.

(56) References Cited

U.S. PATENT DOCUMENTS 7,304,534 B2 * 12/2007 Koller et al. ...................... 330/9
2004/0212435 A1 * 10/2004 Arai et al. ...................... 330/285

FOREIGN PATENT DOCUMENTS

JP 2004-530313 9/2004

* cited by examiner

Primary Examiner — Christian Hannon
(74) Attorney, Agent, or Firm — Wenderoth, Lind & Ponack, L.L.P.

(57) ABSTRACT

Provided is a power supply circuit capable of operating with low noise and low power consumption. In a power supply circuit, a power level control signal Pa for controlling a power level of a power amplifier, and an internal current control signal Pb which is a result of smoothing the power level control signal Pa at predetermined time intervals, are inputted to an operational amplifier. The operational amplifier amplifies the power level control signal Pa, and controls an internal current thereof such that the internal current has a similar characteristic to that of the internal current control signal Pb. A power transistor amplifies an output of the operational amplifier, and supplies a voltage to the power amplifier.

5 Claims, 20 Drawing Sheets

| INTERNAL CURRENT CONTROL SIGNAL Pb | INTERNAL CURRENT |
|---|---|
| Pb1 | a1 |
| Pb2 | a2 |
| Pb3 | a3 |
| Pb4 | a4 |
| Pb5 | a5 |

| OUTPUT OF COMPARING CIRCUIT 2107 | SWITCH |
|---|---|
| High | ON |
| Low | OFF |

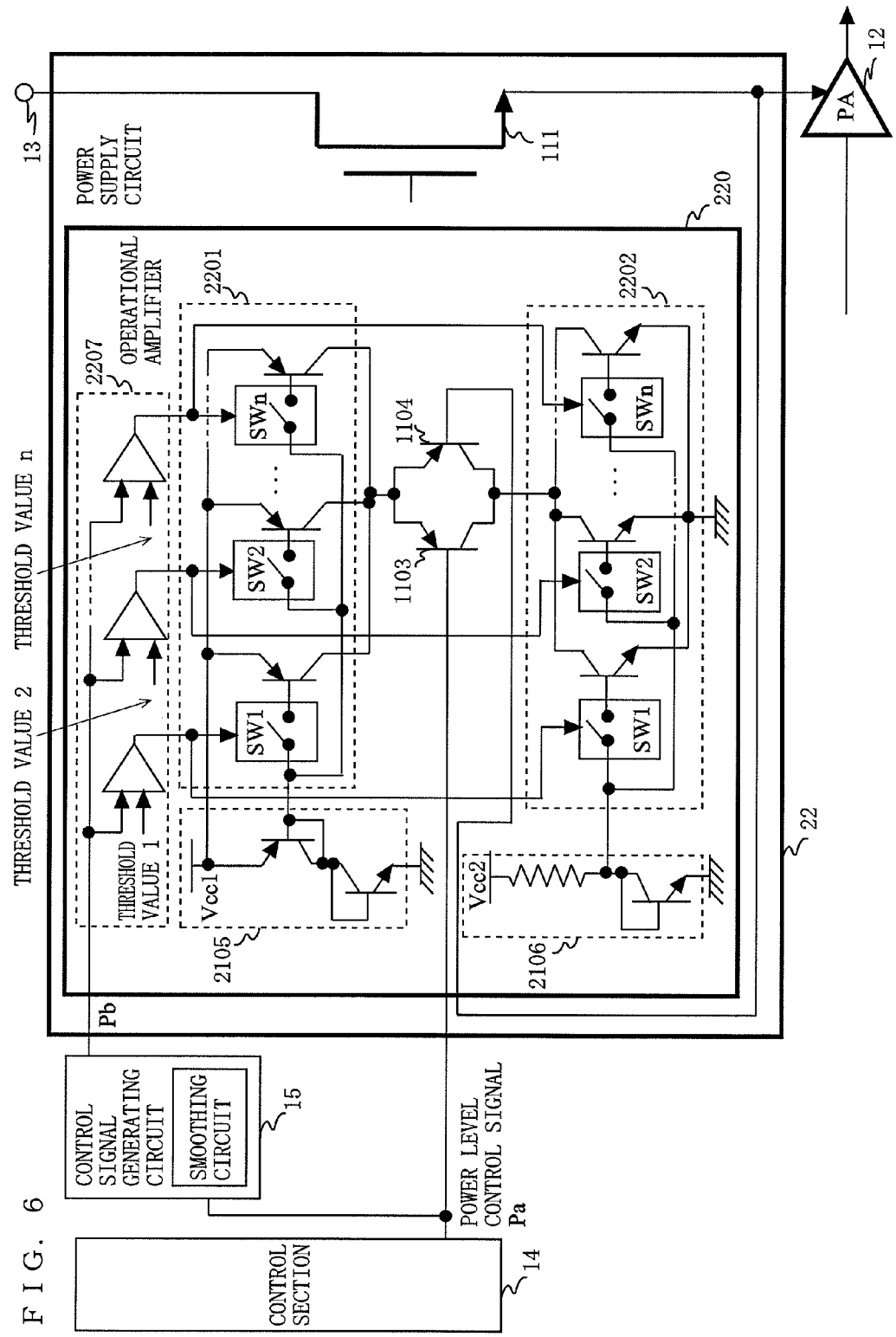
F I G. 6

FIG. 7

| COMPARISON RESULT | SWITCH | | | | | | |
|---|---|---|---|---|---|---|---|
| | SW1 | SW2 | ... | SWk | ... | SWk+1 | ... | SWn |
| THRESHOLD VALUE 1 > Pb | OFF | OFF | ... | OFF | ... | OFF | ... | OFF |
| THRESHOLD VALUE 2 > Pb ≧ THRESHOLD VALUE 1 | ON | OFF | ... | OFF | ... | OFF | ... | OFF |
| · | · | · | · | · | · | · | · | · |
| THRESHOLD VALUE k+1 > Pb ≧ THRESHOLD VALUE k | ON | ON | ... | ON | ... | OFF | ... | OFF |
| · | · | · | · | · | · | · | · | · |
| Pb ≧ THRESHOLD VALUE n | ON | ON | ... | ON | ... | ON | ... | ON |

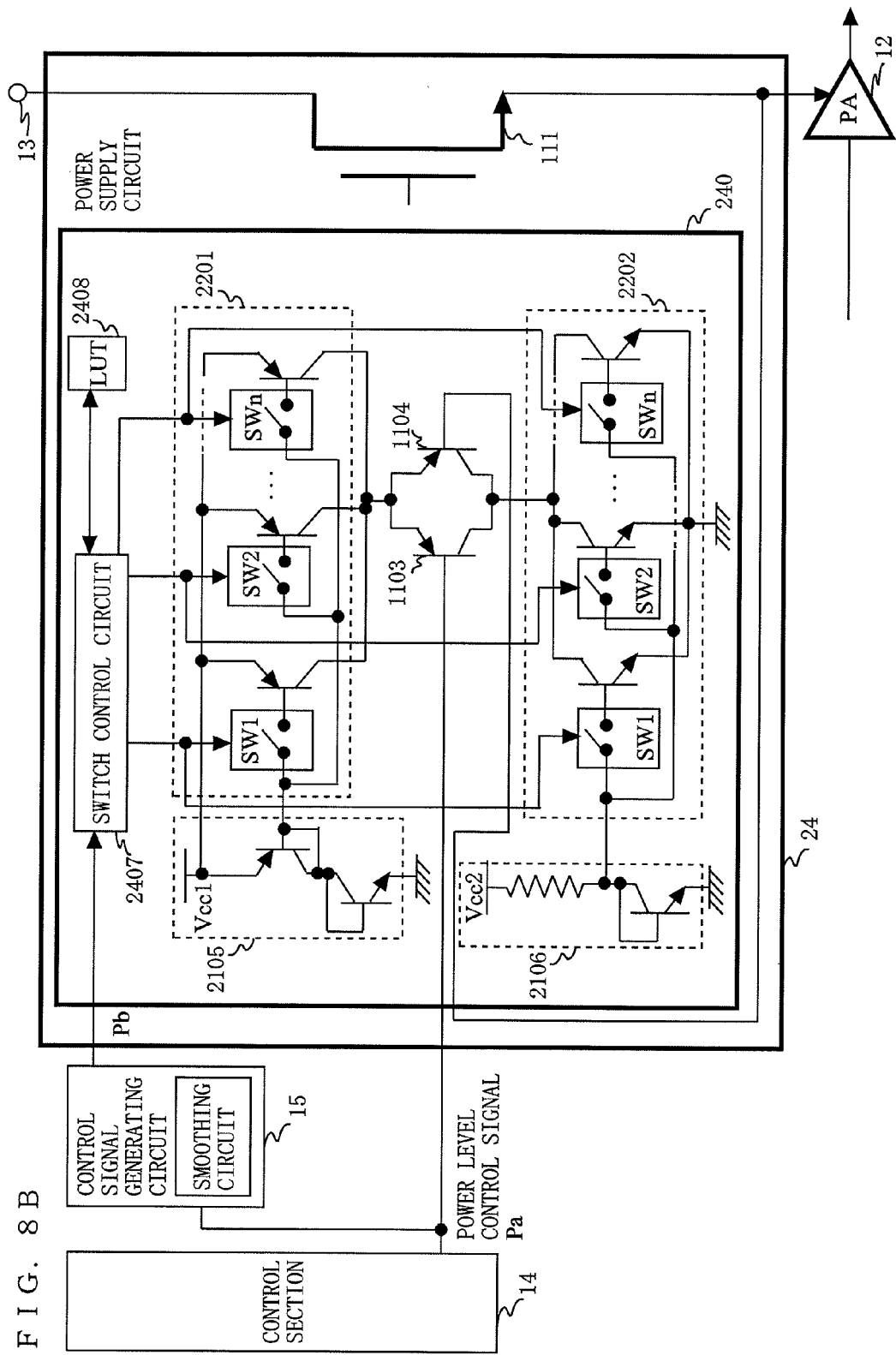

F I G. 9D

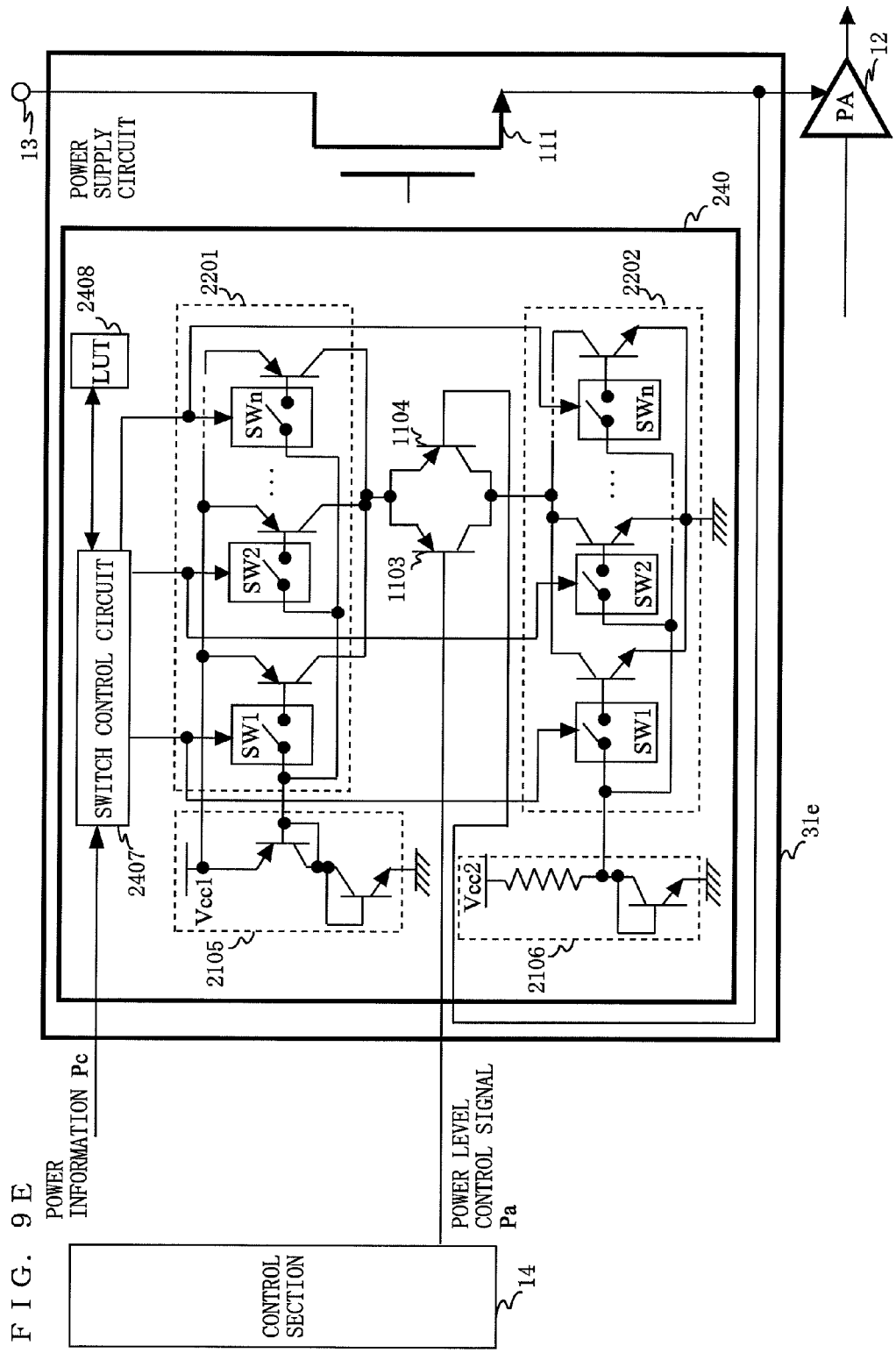
F I G. 9 E

F I G. 1 3 PRIOR ART

POWER SUPPLY CIRCUIT

BACKGROUND OF THE INVENTION

1. Field of the Invention

The present invention relates to a power supply circuit for supplying a voltage to a power amplifier, and particularly to a power supply circuit which is capable of operating with low noise and low power consumption by optimizing an internal current thereof.

2. Description of the Background Art

Communication devices such as mobile phones and wireless LAN devices are required to secure precision of an output signal and operate with low power consumption. In such a communication device, a transmission circuit capable of operating with low distortion and high efficiency is used. Hereinafter, conventional transmission circuits will be described.

One of the conventional transmission circuits is, for example, a transmission circuit which uses a modulation method such as a quadrature modulation method to generate a transmission signal (hereinafter, referred to as a quadrature modulation circuit). Since the quadrature modulation circuit is well known, a description thereof will be omitted. A conventional transmission circuit, which is smaller in size and operates more efficiently than the quadrature modulation circuit, is, e.g., a transmission circuit 500 shown in FIG. 13. FIG. 13 is a block diagram showing an exemplary structure of the conventional transmission circuit 500. In FIG. 13, the conventional transmission circuit 500 comprises a signal generator 501, an output terminal 502, a power supply circuit 503, a power amplifier (PA) 504 and a power supply terminal 505.

In the conventional transmission circuit 500, the signal generator 501 generates an amplitude signal and an angle-modulated signal. The amplitude signal is inputted to the power supply circuit 503. The power supply circuit 503 supplies the power amplifier 504 with a voltage which is controlled in accordance with the inputted amplitude signal. The power supply circuit 503 typically supplies the power amplifier 504 with the voltage which is proportional to a magnitude of the inputted amplitude signal. Here, the power supply circuit 503 is supplied with a DC voltage from the power supply terminal 505.

The angle-modulated signal is inputted to the power amplifier 504. The power amplifier 504 amplifies the angle-modulated signal by using the voltage supplied from the power supply circuit 503, and outputs the amplified signal. The signal amplified at the power amplifier 504 is outputted from the output terminal 502 as a transmission signal. Thus, in the conventional transmission circuit 500, the power supply circuit 503 controls, in accordance with the amplitude signal, the voltage to be supplied to the power amplifier 504, and this allows the power amplifier 504 to operate with low power consumption. The transmission circuit 500 as above is called a polar modulation circuit.

Another one of the conventional circuits is a transmission circuit 600 shown in FIG. 14 which is disclosed by Japanese National Phase PCT Laid-Open Publication No. 2004-530313 (hereinafter, referred to as Patent Document 1). FIG. 14 is a block diagram showing an exemplary structure of the conventional transmission circuit 600. In the conventional transmission circuit 600 shown in FIG. 14, bias control circuits (power supply circuits) 660A and 660B control, in accordance with gain information 628 from a gain control circuit 630, bias currents of RF circuits such as an IF buffer 642, a mixer 644, an RF VGA 546, a power amplifier (PA) 650 and the like. To be specific, the conventional transmission circuit 600 controls, in accordance with a signal gain thereof, the bias currents of the RF circuits such as the power amplifier 650 and the like, thereby enabling the RF circuits to operate with lower power consumption.

However, although the conventional transmission circuit 500 is capable of enabling the power amplifier 504 to operate with low power consumption, the transmission circuit 500 does not realize saving of power consumption of the power supply circuit 503. In particular, when a power level of the power amplifier 504 is low, power consumption of the entire system is small, and a proportion of the power consumption of the power supply circuit 503 in the power consumption of the entire system is relatively large. Thus, the conventional transmission circuit 500 has a problem that when the power level of the power amplifier 504 is low, the power consumption of the power supply circuit 503 causes efficiency deterioration of the entire transmission circuit 500.

Since an internal current of the power supply circuit 503 does not depend on the power level of the power amplifier 504, it seems likely that the power saving of the power supply circuit 503 is realized by reducing the internal current of the power supply circuit 503. In this case, however, there is a problem that noise is increased when the internal current of the power supply circuit 503 is reduced. Thus, the conventional transmission circuit 500 has a problem that it is difficult to reduce both the noise and power consumption of the power supply circuit 503.

Also, the conventional transmission circuit 600 only realizes power saving of the RF circuits such as the power amplifier 650 and the like, and does not realize power saving of the power supply circuits 660A and 660B. Accordingly, the conventional transmission circuit 600 also has a problem that the power consumption of the power supply circuits 660A and 660B causes efficiency deterioration of the transmission circuit 600. Further, the conventional transmission circuit 600 also has a problem that it is difficult to reduce both noise and power consumption of the power supply circuits 660A and 660B since the noise is increased when an internal current of the power supply circuits 660A and 660B is reduced.

SUMMARY OF THE INVENTION

Therefore, an object of the present invention is to provide a power supply circuit which is capable of operating with low noise and low power consumption by optimizing an internal current thereof in accordance with a power level of a power amplifier.

The present invention is directed to a power supply circuit for supplying a voltage to a power amplifier. In order to achieve the above object, the power supply circuit of the present invention comprises: an operational amplifier for amplifying a power level control signal which controls a power level of the power amplifier, and controlling, in accordance with the power level of the power amplifier, an internal current of the operational amplifier at a time of amplifying the power level control signal; and a power transistor for amplifying an output signal of the operational amplifier, and supplying the power amplifier with a voltage. An internal current control signal which indicates the power level of the power amplifier is inputted to the operational amplifier, and the internal current is controlled in accordance with the inputted internal current control signal.

Preferably, the operational amplifier reads, in accordance with the internal current control signal, information about the internal current of the operational amplifier, which information is stored in advance in a lookup table and corresponds to the power level of the power amplifier, and the operational amplifier controls the internal current at the time of amplifying the power level control signal.

Preferably, the power level control signal, which is smoothed at predetermined time intervals, is inputted to the operational amplifier as the internal current control signal. Alternatively, power information, which indicates an average power level of the power amplifier in each slot time, may be inputted from a baseband to the operational amplifier as the internal current control signal.

Preferably, the operational amplifier comprises two transistors for amplifying the power level control signal and two variable current sources for supplying an internal current to the two transistors. In this case, when the internal current control signal increases in magnitude, the two variable current sources increase the internal current to be supplied to the two transistors, and when the internal current control signal decreases in magnitude, the two variable current sources decrease the internal current to be supplied to the two transistors.

The operational amplifier may further comprise a comparing circuit for comparing the internal current control signal with a predetermined threshold value. In such a case, the variable current sources each have: a first transistor connected to a reference current source; a switch whose on/off state is controlled by the comparing circuit; and a second transistor connected to the reference current source via the switch. When the internal current control signal is equal to or greater than the predetermined threshold value, the comparing circuit turns on the switch, and when the internal current control signal is smaller than the predetermined threshold value, the comparing circuit turns off the switch.

Alternatively, the operational amplifier may further comprise n comparing circuits each for comparing the internal current control signal with a predetermined threshold value. In such a case, the variable current sources each comprise: n switches whose on/off states are controlled by the n comparing circuits, respectively; and n transistors which are connected to a reference current source via the n switches, respectively. The n comparing circuits respectively have n threshold values in ascending order, and when the internal current control signal is equal to or greater than a threshold value k and smaller than a threshold value k+1, 1st to kth switches among the n switches are turned on, and k+1th to nth switches are turned off.

The operational amplifier may comprise: a control circuit for reading information about the internal current of the operational amplifier from the lookup table, in accordance with the internal current control signal; two transistors for amplifying the power level control signal; and two variable current sources for supplying the internal current to the two transistors. The two variable current sources each have: a first transistor connected to the reference current source; a switch whose on/off state is controlled by the control circuit; and a second transistor connected to the reference current source via the switch. In this case, the control circuit controls the on/off state of the switch in accordance with the information, read from the lookup table, about the internal current of the operational amplifier.

Alternatively, the operational amplifier may comprise: a control circuit for reading the information about the internal current of the operational amplifier from the lookup table, in accordance with the internal current control signal; n switches whose on/off states are controlled by the control circuit; and n transistors which are connected to a reference current source via the n switches, respectively. In such a case, the control circuit controls the on/off states of the n switches in accordance with the information, read from the lookup table, about the internal current of the operational amplifier.

The present invention is also directed to a transmission circuit for generating a transmission signal. In order to achieve the above-mentioned object, the transmission circuit comprises: a signal generator for generating an amplitude signal and an angle-modulated signal; a power amplifier for amplifying the angle-modulated signal, and outputting the amplified signal as the transmission signal; and a power supply circuit for supplying the power amplifier with a voltage which is controlled in accordance with the amplitude signal. The power supply circuit has: an operational amplifier for amplifying the amplitude signal and controlling, in accordance with a power level of the power amplifier, an internal current of the operational amplifier at a time of amplifying the amplitude signal; and a power transistor for amplifying an output signal of the operational amplifier, and supplying the power amplifier with a voltage. An internal current control signal, which indicates the power level of the power amplifier, is inputted to the operational amplifier, and the internal current is controlled in accordance with the inputted internal current control signal.

The present invention is also directed to a communication device comprising the above-described transmission circuit. The communication device comprises: the transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, the power supply circuit according to the present invention is able to, in the case where the power level of the power amplifier is low, improve power efficiency of the entire system and keep a generated noise to an acceptable level, by reducing the internal current in accordance with the internal current control signal, and in the case where the power level of the power amplifier is high, keep the generated noise to an acceptable level without causing deterioration in the power efficiency of the entire system, by increasing the internal current in accordance with the internal current control signal. This allows the power supply circuit to operate with low noise and low power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows a relationship between an output of a comparing circuit 2107 and an operation of a switch;

FIG. 6 is a block diagram showing an exemplary structure of a power supply circuit 22 according to the second embodiment of the present invention;

FIG. 7 shows relationships between comparison results, of the internal current control signal Pb and a threshold value k, and operations of switches;

FIG. 8B is a block diagram showing an exemplary structure of a power supply circuit 24 according to the second embodiment of the present invention;

FIG. 9D is a block diagram showing an exemplary structure of a power supply circuit 31d according to the third embodiment of the present invention;

FIG. 9E is a block diagram showing an exemplary structure of a power supply circuit 31e according to the third embodiment of the present invention;

DESCRIPTION OF THE PREFERRED EMBODIMENTS

First Embodiment

Figure 1A:
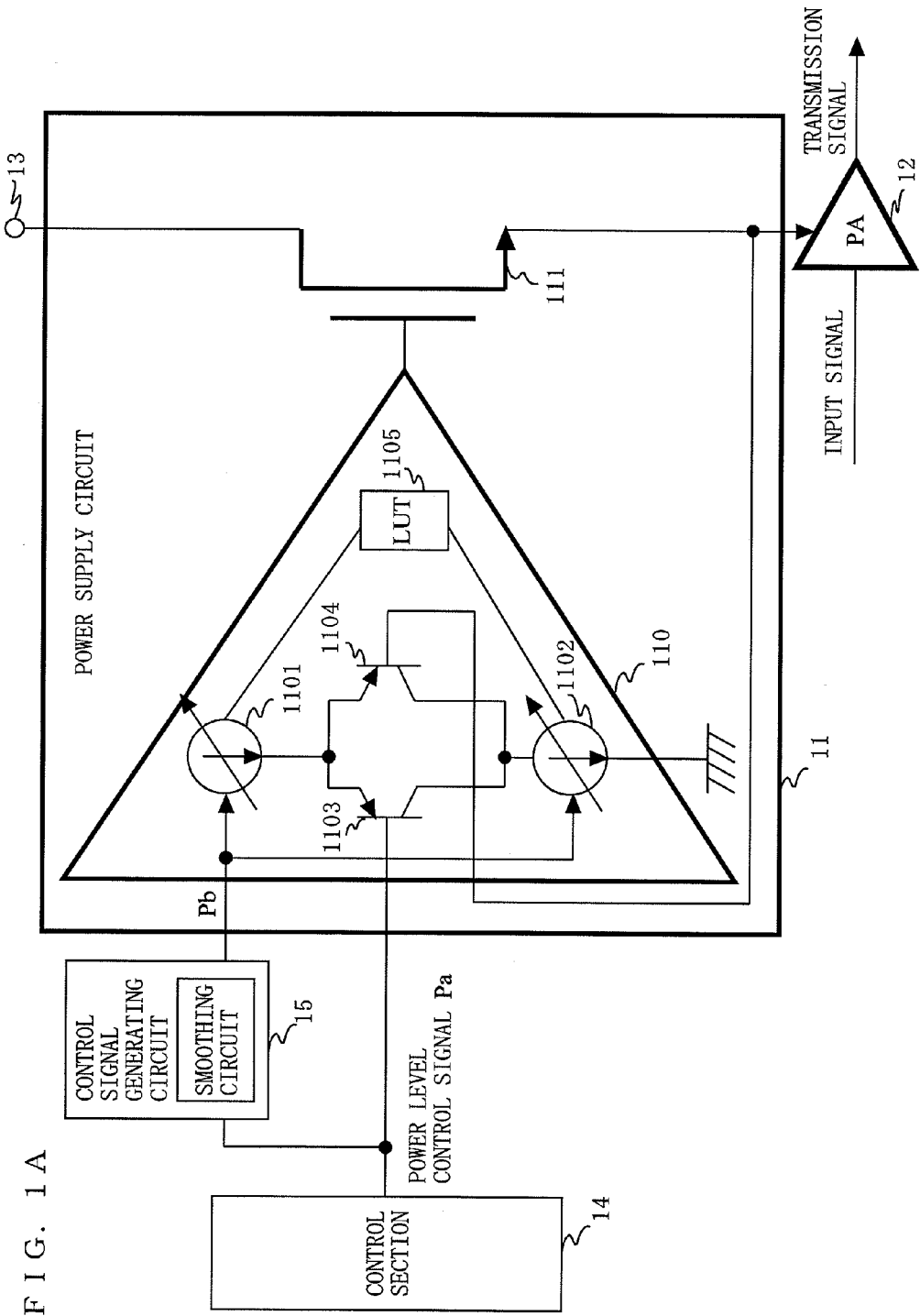
FIG. 1A is a block diagram showing an exemplary structure of a power supply circuit 11 according to a first embodiment of the present invention.
Figure 2A:
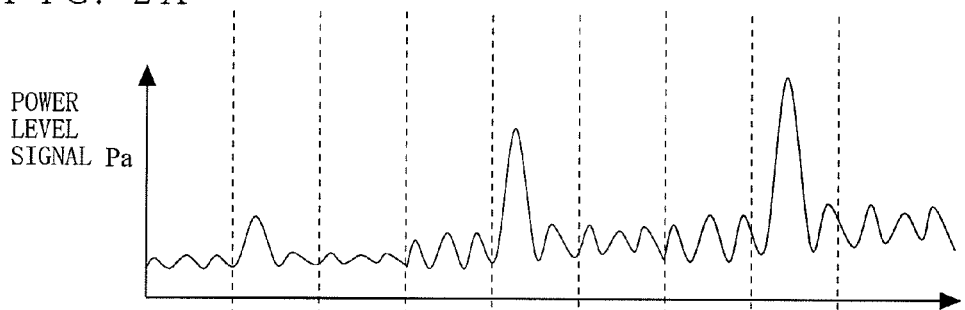
FIG. 2A shows an example of a waveform of a power level control signal Pa.
Figure 2B:
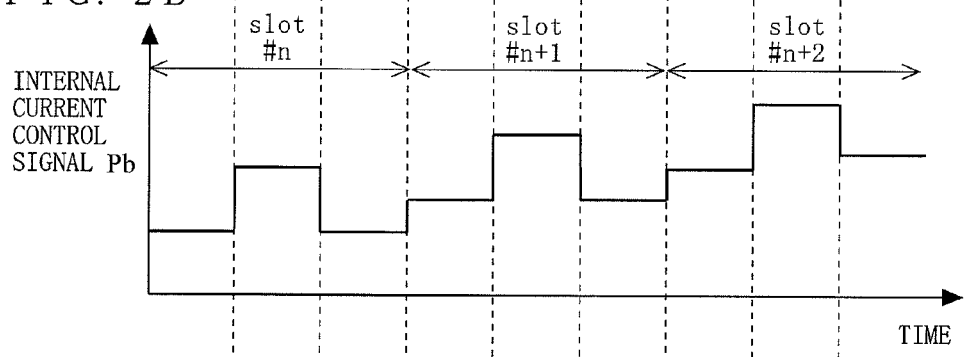
FIG. 2B shows an example of a waveform of an internal current control signal Pb.

FIG. 1A is a block diagram showing an exemplary structure of a power supply circuit 11 according to a first embodiment of the present invention. As shown in FIG. 1A, the power supply circuit 11 is connected to a power amplifier (PA) 12, a power supply terminal 13, a control section 14 and a control signal generating circuit 15. The control section 14 outputs a power level control signal Pa (see FIG. 2A) for controlling a power level of the power amplifier 12. The control signal generating circuit 15 smoothes the power level control signal Pa at predetermined time intervals T, and outputs the smoothed signal as an internal current control signal Pb (see FIG. 2B) for controlling an internal current of the power supply circuit 11. The control signal generating circuit 15 is structured with, e.g., a smoothing circuit. As shown in FIG. 2B, the internal current control signal Pb has a waveform in which a DC component varies at the predetermined time intervals T. Here, it is preferred that the predetermined time interval T is set to be shorter than a period of time which is required for controlling the power level of the power amplifier 12 (hereinafter, referred to as a slot time).

The power supply circuit 11 controls the internal current in accordance with the internal current control signal Pb, and supplies the power amplifier 12 with a voltage which is controlled in accordance with the power level control signal Pa. Note that, the power supply circuit 11 is supplied with a DC voltage from the power supply terminal 13. The power amplifier 12 amplifies an input signal in accordance with a voltage supplied from the power supply circuit 11, and outputs the amplified signal as a transmission signal.

To be specific, the power supply circuit 11 comprises an operational amplifier 110 and a power transistor 111. The operational amplifier 110 controls the internal current in accordance with the internal current control signal Pb, amplifies the power level control signal Pa, and outputs the amplified signal to the power transistor 111. The power transistor 111 amplifies the output signal of the operational amplifier 110, and supplies the power amplifier 12 with the voltage.

Described next is an exemplary structure of the operational amplifier 110. The operational amplifier 110 includes variable current sources 1101 and 1102, transistors 1103 and 1104, and a lookup table (LUT) 1105. The internal current control signal Pb is inputted to the variable current sources 1101 and 1102. By reading from the LUT 1105 a value of the internal current which corresponds to a value of the internal current control signal Pb, the variable current sources 1101 and 1102 control the internal current to be supplied to the transistors 1103 and 1104. Here, the LUT 1105 stores, in advance, optimal values of the internal current to be supplied to the transistors 1103 and 1104, the optimal values corresponding to values of the internal current control signal Pb (see FIG. 3, for example). Note that, the power supply circuit 110 may have the LUT 1105 outside the operational amplifier 110.

Figure 2C:
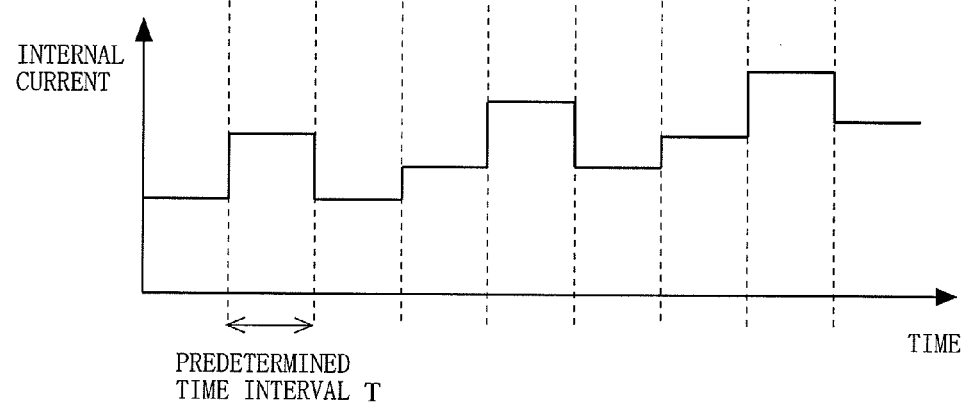
FIG. 2C shows an example of a waveform of an internal current.
Figures 2D, 3:
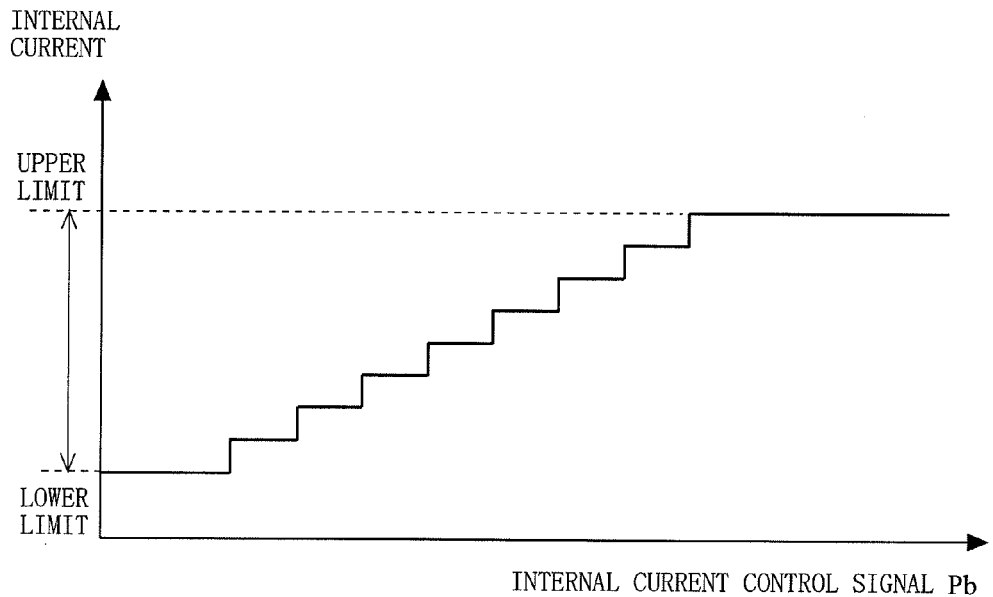
FIG. 2D shows a relationship between the internal current control signal Pb and the internal current.
FIG. 3 shows an example of stored contents in an LUT 1105.

A specific manner of controlling the internal current is such that the variable current sources 1101 and 1102 increase the internal current when the internal current control signal Pb increases in magnitude, and reduces the internal current when the internal current control signal Pb decreases in magnitude. In other words, the variable current sources 1101 and 1102 control the internal current such that the internal current has a similar characteristic as that of the internal current control signal Pb. FIG. 2C shows an example of a waveform of the internal current. As shown in FIG. 2C, the internal current has, similarly to the internal current control signal Pb, a waveform in which a DC component varies at the predetermined time intervals T. Here, upper and lower limit values may be set for a range of the variation of the internal current. FIG. 2D shows a relationship between the internal current control signal Pb and the internal current. As shown in FIG. 2D, set as the upper limit value of the internal current is, e.g., a maximum value of the internal current which the system can tolerate. Also, set as the lower limit value of the internal current is, e.g., a minimum value of the internal current which the system can tolerate. Note that, the upper and lower limit values, which specify the range of the variation of the internal current, may be set to be arbitrary values.

The LUT 1105 may store, in advance, a calculation formula for calculating, in accordance with the internal current control signal Pb, an optimal value of the internal current to be supplied to the transistors 1103 and 1104. In this case, by assigning a value of the internal current control signal Pb to the calculation formula read by the LUT 1105, the variable current sources 1101 and 1102 can calculate the optimal value of the internal current. Note that, the calculation formula may have an arbitrary order. The formula may be a monomial or a polynomial.

Described next is an effect which is obtained as a result of the power supply circuit 11 controlling the internal current in accordance with the internal current control signal Pb. When the power level of the power amplifier 12 is low, power consumption of the entire system is small, and a proportion of power consumption of the power supply circuit 11 in the power consumption of the entire system is relatively large. Also, when the power level of the power amplifier 12 is low, the power level control signal Pa and the internal current control signal Pb are small in magnitude. For this reason, when the power level of the power amplifier 12 is low and the internal current control signal Pb is small in magnitude, the power supply circuit 11 can improve power efficiency of the entire system, by reducing the internal current of the power supply circuit 11 in accordance with the internal current control signal Pb to reduce the power consumption of the power supply circuit 11.

Further, when the power level of the power amplifier 12 is low, a level of amplification of a noise generated at the power supply circuit 11 is also low, and therefore, a high noise characteristic is not required for the power supply circuit 11. For this reason, even if the power supply circuit 11 reduces the internal current in accordance with the internal current control signal Pb, the noise generated at the power supply circuit 11 can be kept to an acceptable level.

On the other hand, when the power level of the power amplifier 12 is high, the power consumption of the entire system is large, and a proportion of the power consumption of the power supply circuit 11 in the power consumption of the entire system is relatively small. Also, when the power level of the power amplifier 12 is high, the power level control signal Pa and the internal current control signal Pb are large in magnitude. For this reason, in the case where the power level of the power amplifier 12 is high and the internal current control signal Pb is large in magnitude, even if the power supply circuit 11 increases the internal current in accordance with the internal current control signal Pb and thereby increases the power consumption of the power supply circuit 11, this does not cause deterioration in power efficiency of the entire system.

Further, when the power level of the power amplifier 12 is high, a level of amplification of the noise generated at the power supply circuit 11 is also high, and therefore, a high noise characteristic is required for the power supply circuit 11. For this reason, by increasing the internal current in accordance with the internal current control signal Pb, the power supply circuit 11 can keep the noise generated therein to an acceptable level.

As described above, the power supply circuit 11 according to the first embodiment of the present invention is able to, in the case where the power level of the power amplifier 12 is low, keep the generated noise to an acceptable level and improve the power efficiency of the entire system, by reducing the internal current in accordance with the internal current control signal Pb, and in the case where the power level of the power amplifier 12 is high, keep the generated noise to an acceptable level without causing deterioration in the power efficiency of the entire system, by increasing the internal current in accordance with the internal current control signal Pb. This allows the power supply circuit 11 to operate with low noise and low power consumption.

Figure 1B:
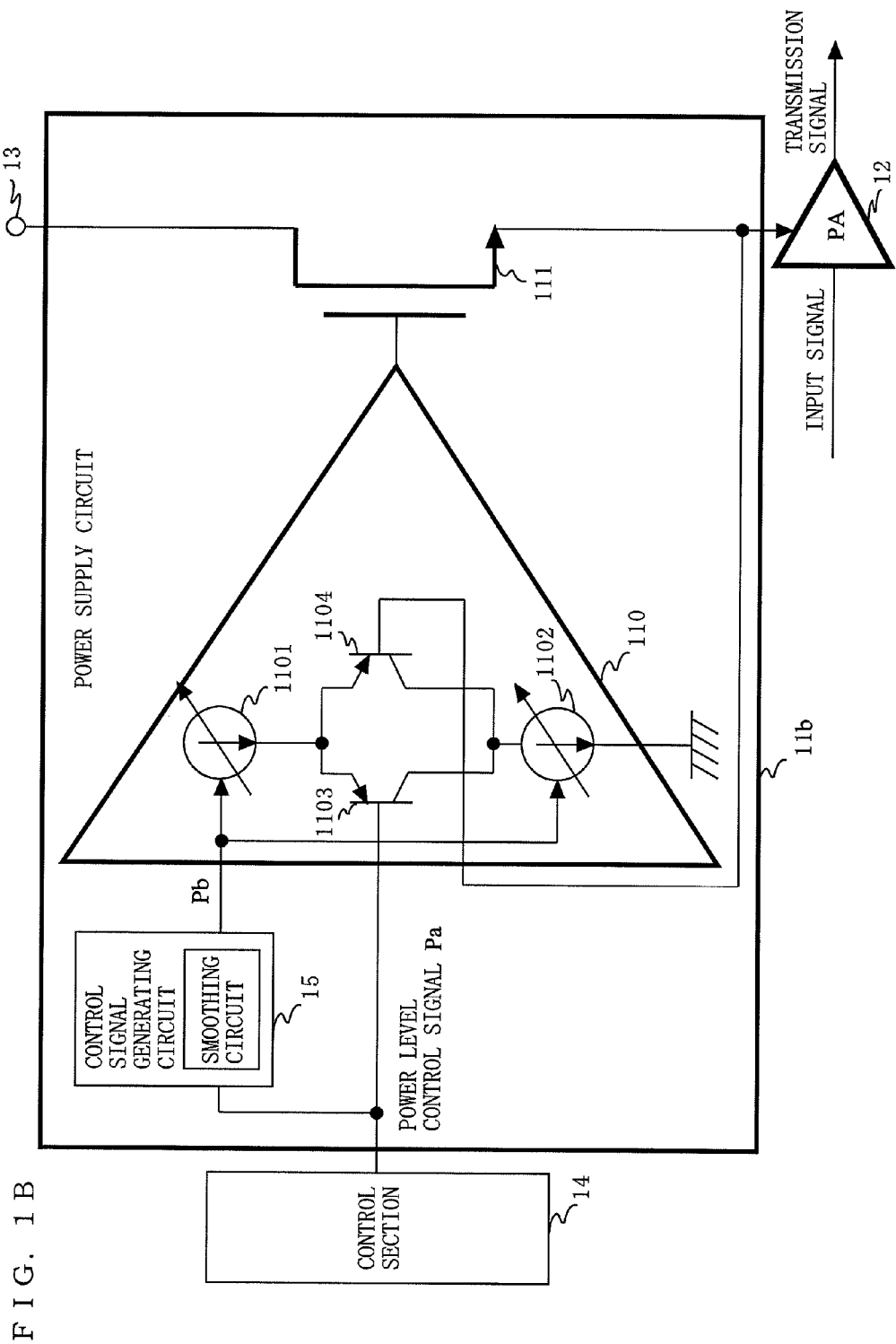
FIG. 1B is a block diagram showing an exemplary structure of a power supply circuit 11b according to the first embodiment of the present invention.

Note that, similarly to a power supply circuit 11b shown in FIG. 1B, the power supply circuit 11 according to the first embodiment may include the control signal generating circuit 15. Even with such a structure, the power supply circuit 11b can provide the same effect as that of the above-described power supply circuit 11.

Further, the power transistor 111 may be structured with any type of transistor. For example, the power transistor 111 may be structured with an N-type or P-type FET, a bipolar transistor, or the like. The same is true for the transistor 1103 and the transistor 1104.

Second Embodiment

Figure 4:
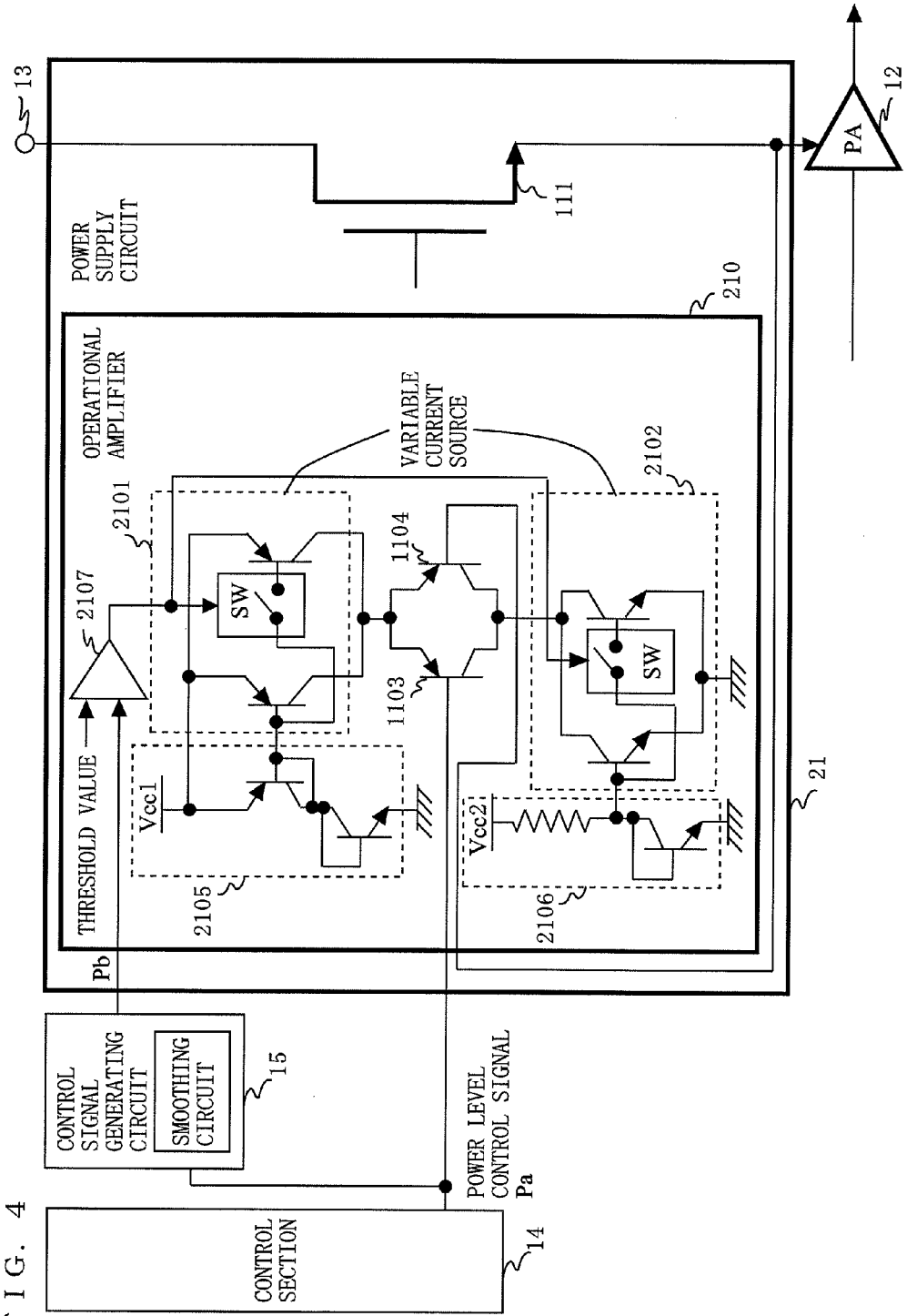
FIG. 4 is a block diagram showing an exemplary structure of a power supply circuit 21 according to a second embodiment of the present invention.

FIG. 4 is a block diagram showing an exemplary structure of a power supply circuit 21 according to a second embodiment of the present invention. As shown in FIG. 4, an operational amplifier 210 of the power supply circuit 21 has a different structure from that of the operational amplifier 110 of the first embodiment. The operational amplifier 210 comprises variable current sources 2101 and 2102, the transistors 1103 and 1104, reference current sources 2105 and 2106, and a comparing circuit 2107.

The variable current source 2101 has a transistor which is connected to the reference current source 2105, a switch whose on/off state is controlled by the comparing circuit 2107, and a transistor which is connected to the reference current source 2105 via the switch. The variable current source 2102 has a transistor which is connected to the reference current source 2106, a switch whose on/off state is controlled by the comparing circuit 2107, and a transistor which is connected to the reference current source 2106 via the switch. FIG. 5 shows a relationship between an output of the comparing circuit 2107 and an operation performed by the switches. Referring to FIG. 5, the comparing circuit 2107 compares the internal current control signal Pb with a predetermined threshold value. When the internal current control signal Pb is equal to or greater than the predetermined threshold value, the comparing circuit 2107 outputs "High", and when the internal current control signal Pb is smaller than the predetermined threshold value, the comparing circuit 2107 outputs "Low". When "High" is inputted from the comparing circuit 2107 to the switches, each switch connects corresponding two transistors. On the other hand, when "Low" is inputted from the comparing circuit 2107 to the switches, each switch disconnects the corresponding two transistors.

Thus, the comparing circuit 2107 compares the internal current control signal Pb with the predetermined threshold value. When the internal current control signal Pb is equal to or greater than the predetermined threshold value, the switches of the variable current sources 2101 and 2102 are turned on. When the internal current control signal Pb is smaller than the predetermined threshold value, the switches of the variable current sources 2101 and 2102 are turned off. This allows, similarly to the first embodiment, the variable current sources 2101 and 2102 to, when the internal current control signal Pb is large, increase the internal current to be supplied to the transistors 1103 and 1104, and when the internal current control signal Pb is small, reduce the internal current to be supplied to the transistors 1103 and 1104.

Note that, the power supply circuit according to the second embodiment of the present invention may be structured in a similar manner to that of a power supply circuit 22 shown in FIG. 6 which has an operational amplifier 220. FIG. 6 is a block diagram showing an exemplary structure of the power supply circuit 22 according to the second embodiment of the present invention. As shown in FIG. 6, the operational amplifier 220 comprises variable current amplifiers 2201 and 2202, the transistors 1103 and 1104, the reference current sources 2105 and 2106, and a comparing circuit 2207.

The variable current amplifier 2201 has n switches whose on/off states are controlled by the comparing circuit 2207, and n transistors which are connected to the reference current source 2105 via the n switches. The variable current amplifier 2202 has n switches whose on/off states are controlled by the comparing circuit 2207, and n transistors which are connected to the reference current source 2106 via the n switches. The comparing circuit 2207 has n comparing circuits. The n comparing circuits respectively have n threshold values in ascending order. Here, the following relationship is realized among the n threshold values: threshold value 1< ... < threshold value k<threshold value k+1< ... < threshold value n. The threshold value n is an arbitrary natural number greater than 1, and the threshold value k is an arbitrary natural number equal to or smaller than n.

FIG. 7 shows relationships between comparison results, of the internal current control signal Pb and the threshold value k, and operations of the switches. Referring to FIG. 7, the comparing circuit 2207 compares the internal current control signal Pb with the threshold value k. When the internal current control signal Pb is greater than the threshold value k, and equal to or smaller than the threshold value k+1, 1st to kth switches are turned on, and k+1th to nth switches are turned off. This allows, similarly to the first embodiment, the variable current amplifiers 2201 and 2202 to control, in accordance with the internal current control signal Pb, the internal current to be supplied to the transistors 1103 and 104.

Figure 8A:
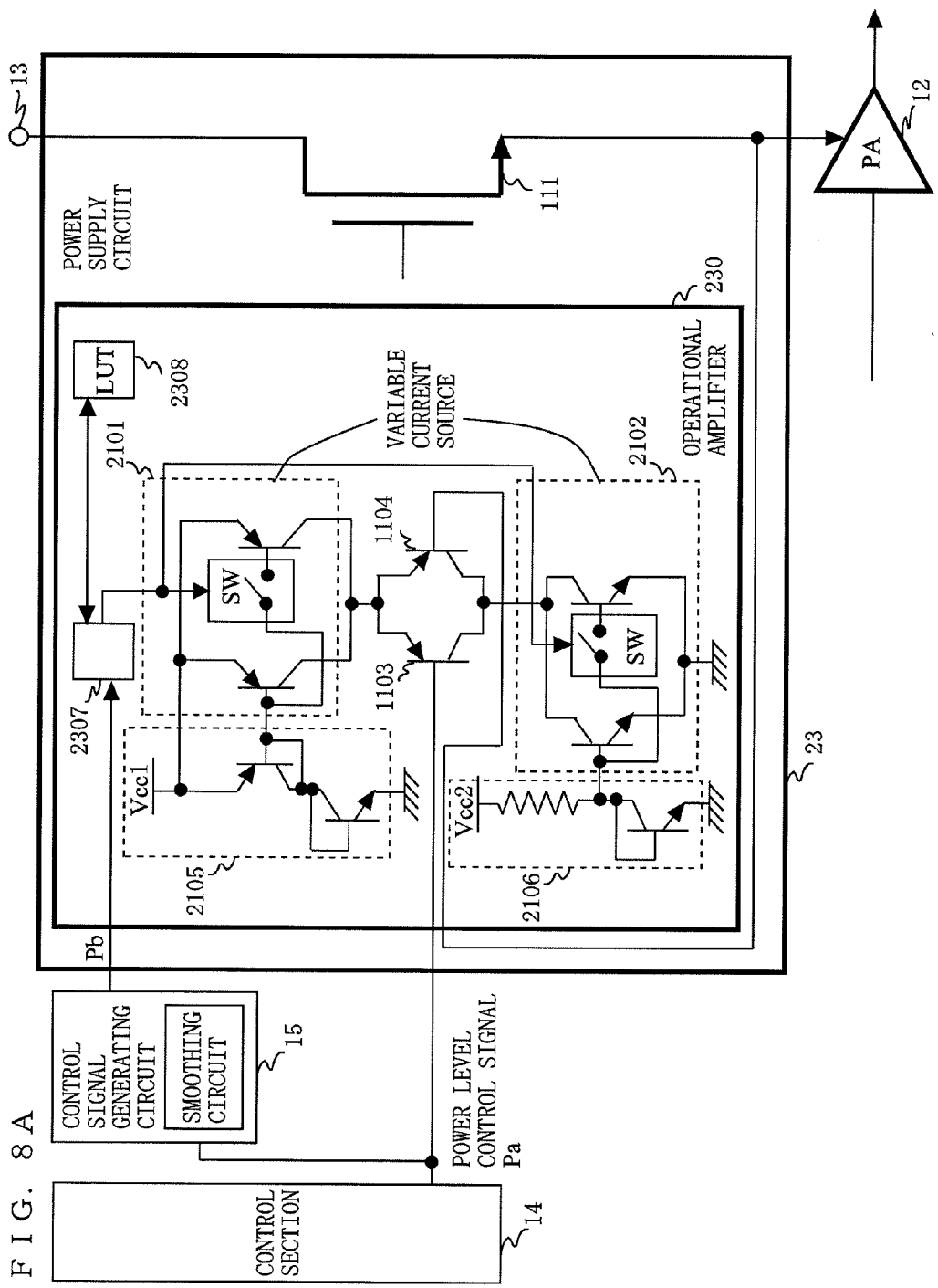
FIG. 8A is a block diagram showing an exemplary structure of a power supply circuit 23 according to the second embodiment of the present invention.

The power supply circuit according to the second embodiment of the present invention may have a similar structure to that of a power supply circuit 23 shown in FIG. 8A which has an operational amplifier 230, or of a power supply circuit 24 shown in FIG. 8B which has an operational amplifier 240. FIG. 8A is a block diagram showing an exemplary structure of the power supply circuit 23 according to the second embodiment of the present invention. The operational amplifier 230 in the power supply circuit 23 shown in FIG. 8A is different from the operational amplifier 210 shown in FIG. 4 in that the operational amplifier 230 has a switch control circuit 2307 and a LUT 2308 instead of the comparing circuit 2107. The switch control circuit 2307 refers to the LUT 2308 to control turning on/off of the switches of the variable current sources 2101 and 2102. The LUT 2308 stores, in advance, information whether to turn on or off, in accordance with the internal current control signal Pb, the switches of the variable current sources 2101 and 2102.

FIG. 8B is a block diagram showing an exemplary structure of the power supply circuit 24 according to the second embodiment of the present invention. The operational amplifier 240 of the power supply circuit 24 shown in FIG. 8B is different from the operational amplifier 220 shown in FIG. 6 in that the operational amplifier 240 has a switch control circuit 2407 and a LUT 2408 instead of the comparing circuit 2207. The switch control circuit 2407 refers to the LUT 2408 to control turning on/off of the switches of the variable current sources 2101 and 2102. The LUT 2408 stores, in advance, information whether to turn on or off, in accordance with the internal current control signal Pb, the switches of the variable current sources 2101 and 2102.

Third Embodiment

Figure 9A:
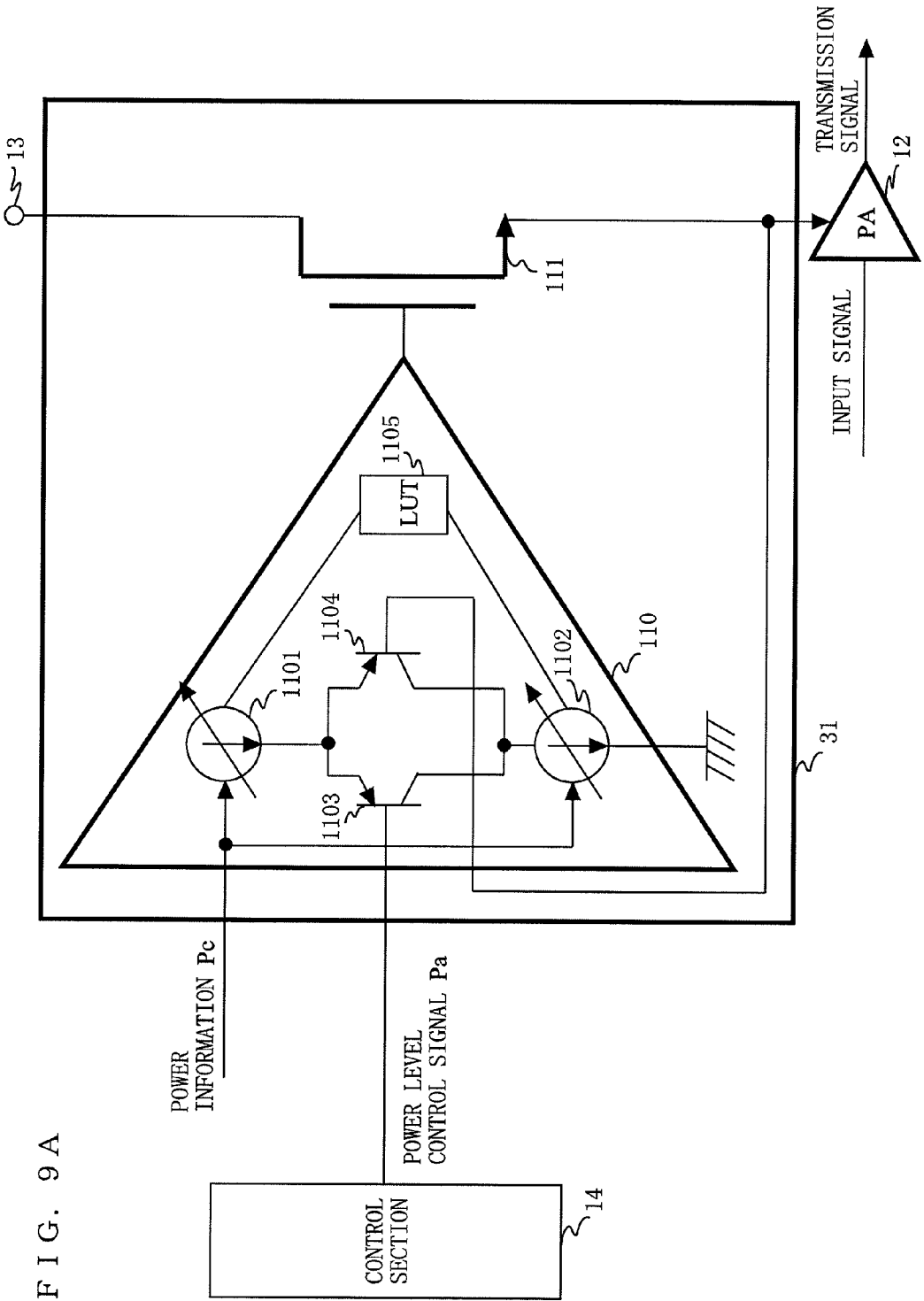
FIG. 9A is a block diagram showing an exemplary structure of a power supply circuit 31 according to a third embodiment of the present invention.
Figure 9B:
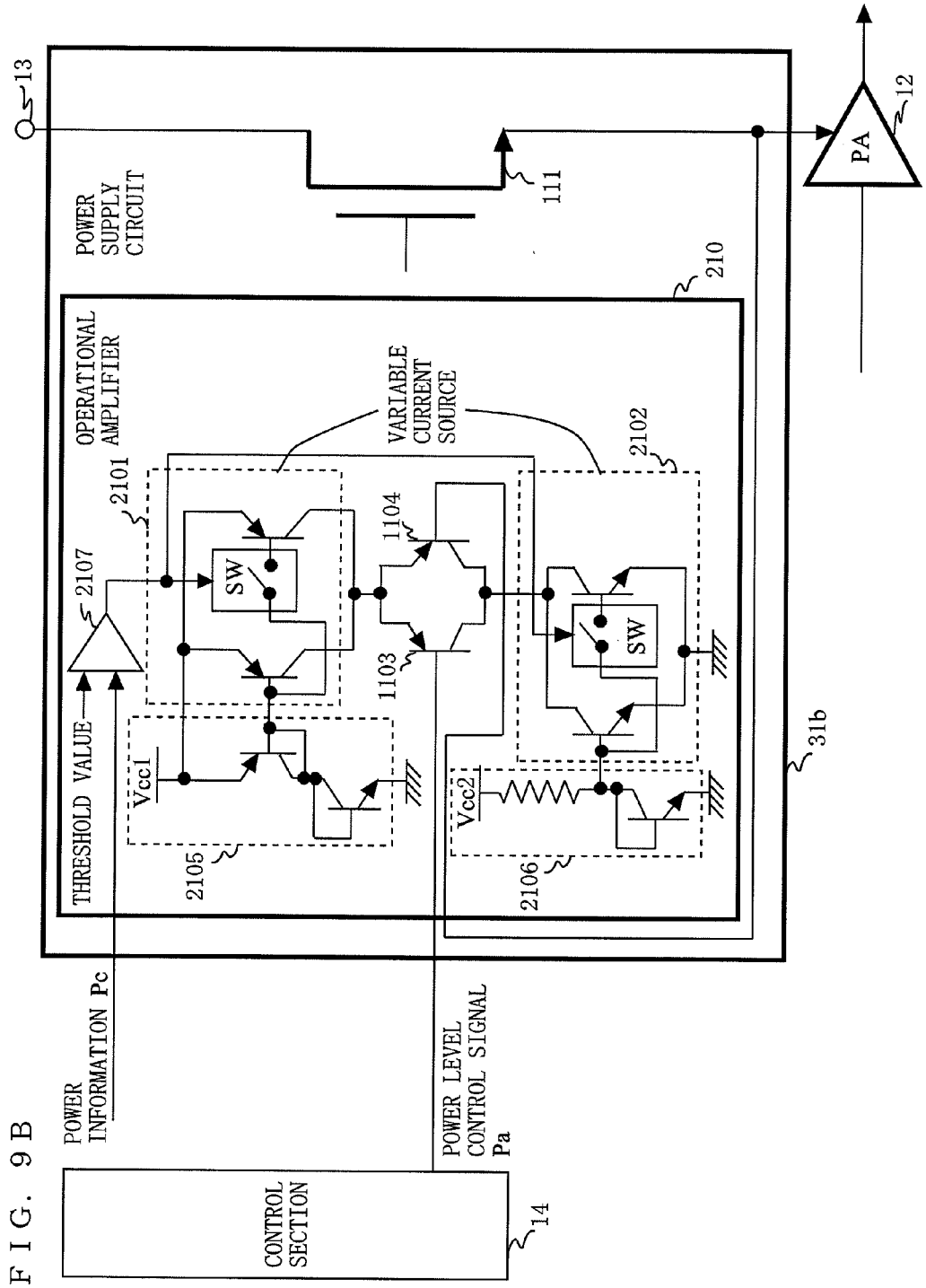
FIG. 9B is a block diagram showing an exemplary structure of a power supply circuit 31b according to the third embodiment of the present invention.
Figure 9C:
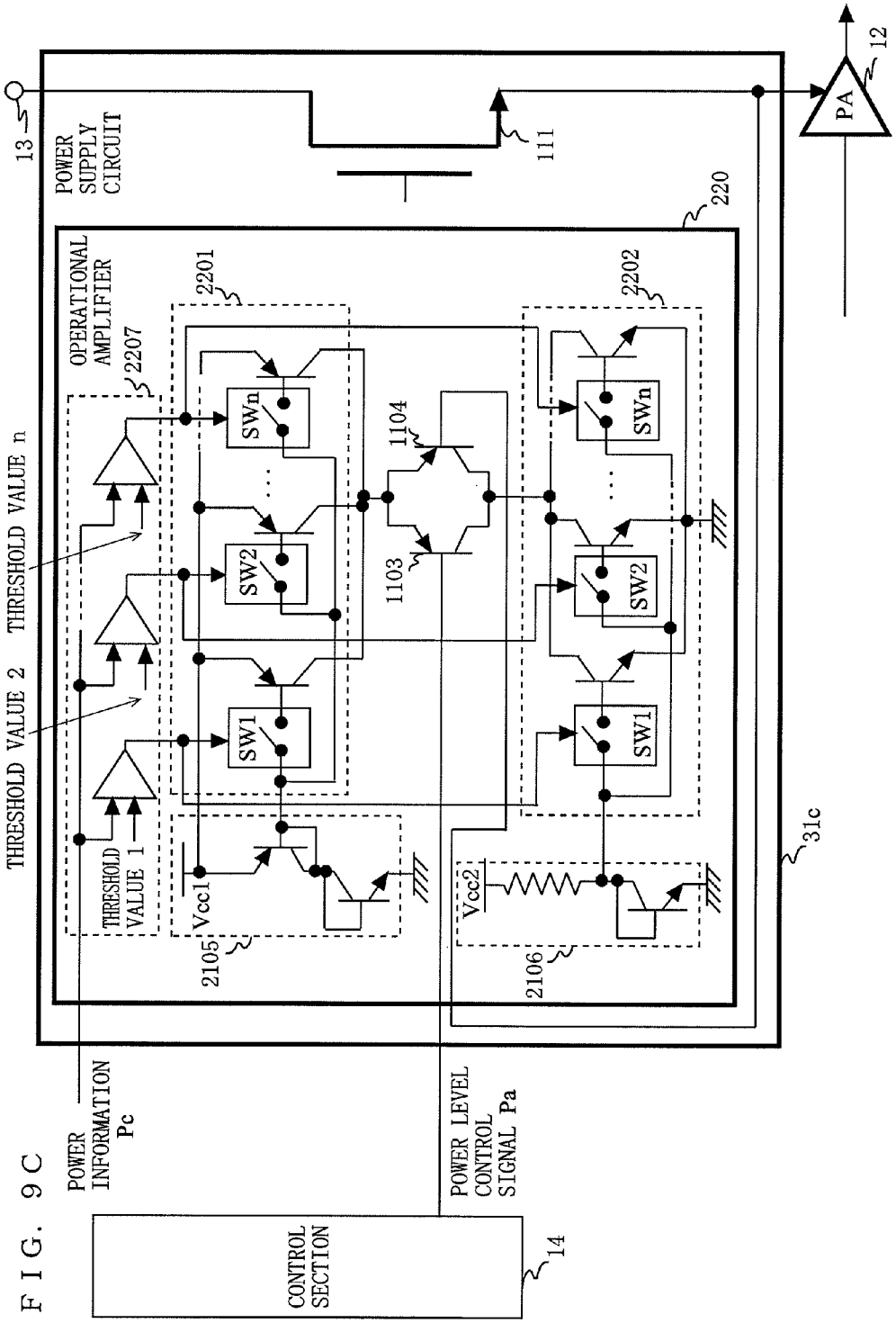
FIG. 9C is a block diagram showing an exemplary structure of a power supply circuit 31c according to the third embodiment of the present invention.
Figure 9D:
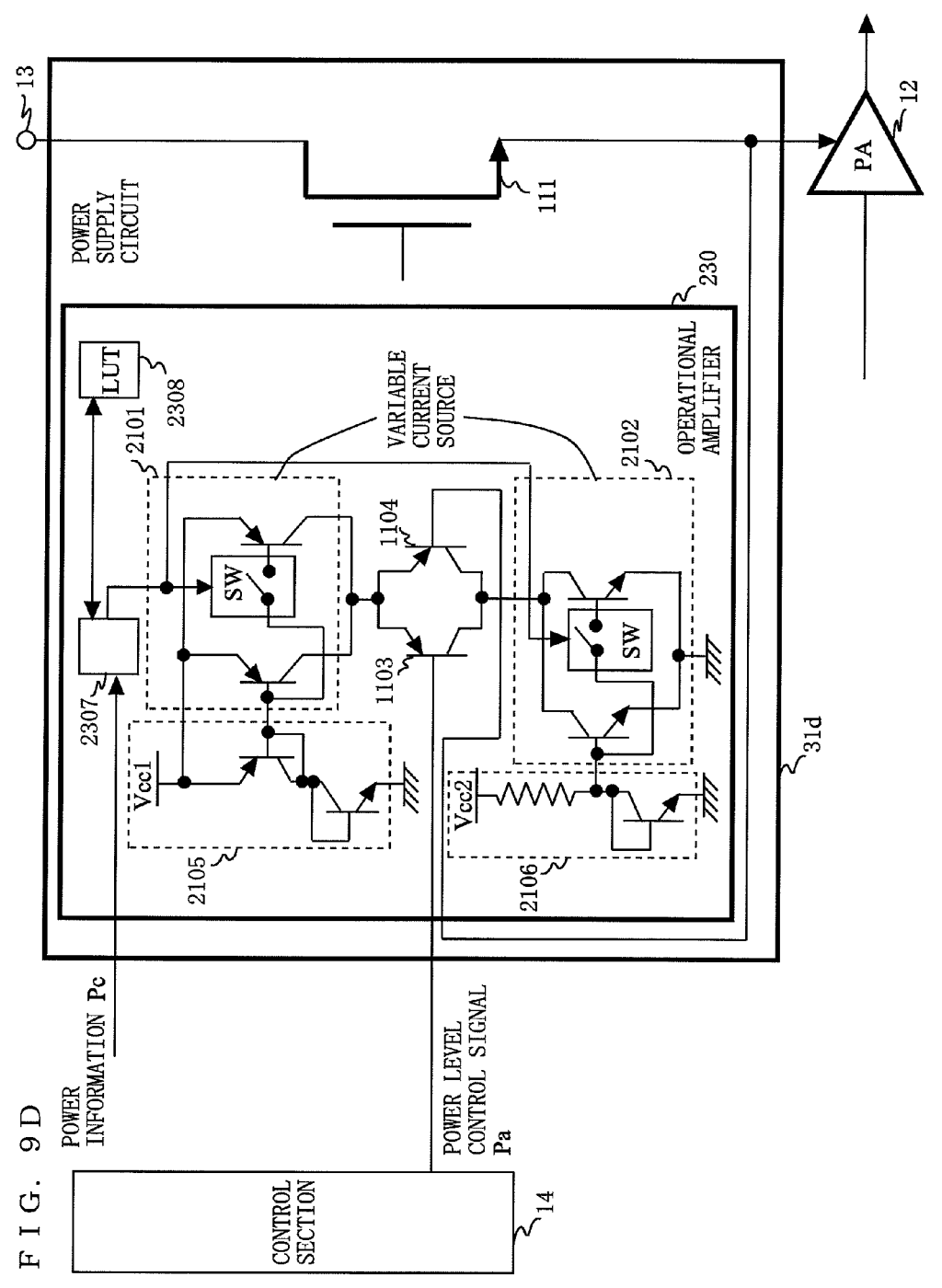
Figure 10A:
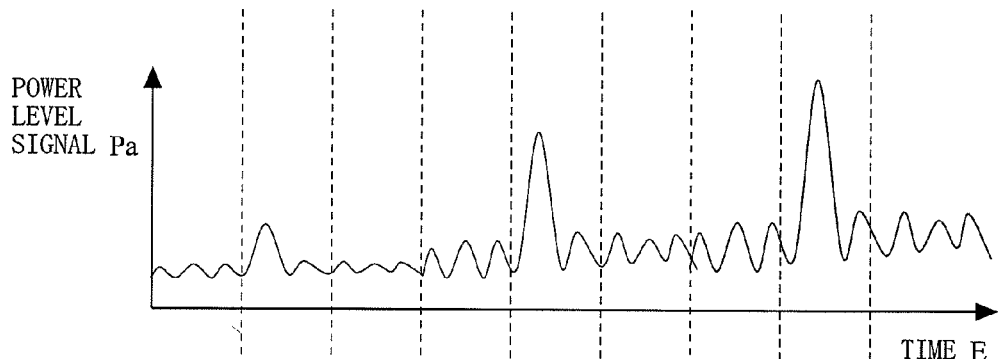
FIG. 10A shows an example of a waveform of the power level control signal Pa.
Figure 10B:
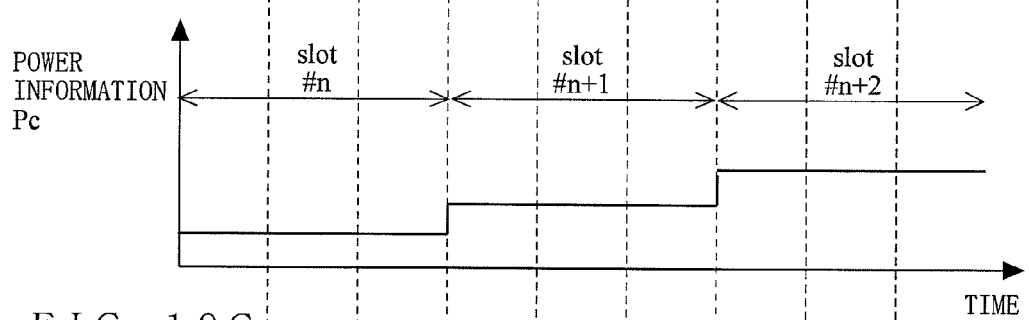
FIG. 10B shows an example of a waveform of power information Pc.

FIG. 9A is a block diagram showing an exemplary structure of a power supply circuit 31 according to a third embodiment of the present invention. In FIG. 9A, the power supply circuit 31 according to the third embodiment is different from the power supply circuits according to the first and second embodiments in that in the power supply circuit 31, power information Pc (see FIG. 10B), instead of the internal current control signal Pb inputted from the control signal generating circuit 15, is inputted from a baseband. The power information Pc is information which is inputted from the baseband and which indicates an average power level of the power amplifier 12 in each slot time. The power supply circuit 31 has a similar structure to that of the power supply circuits according to the first and second embodiments. Hereinafter, operations of the power supply circuit 31 according to the third embodiment will be described.

The control section 14 outputs the power level control signal Pa (see FIG. 10A) for controlling the power level of the power amplifier 12. The power supply circuit 31 controls an internal current thereof in accordance with the power information Pc, and supplies the power amplifier 12 with a voltage controlled in accordance with the power level control signal Pa. To be specific, in the power supply circuit 31, the variable current sources 1101 and 1102 read, from the LUT 1105, a value of the internal current which corresponds to a value of the power information Pc, thereby controlling the internal current to be supplied to the transistors 1103 and 1104. Here, the LUT 1105 stores, in advance, optimal values of the internal current to be supplied to the transistors 1103 and 1104, the optimal values corresponding to values of the power information Pc.

Figure 10C:
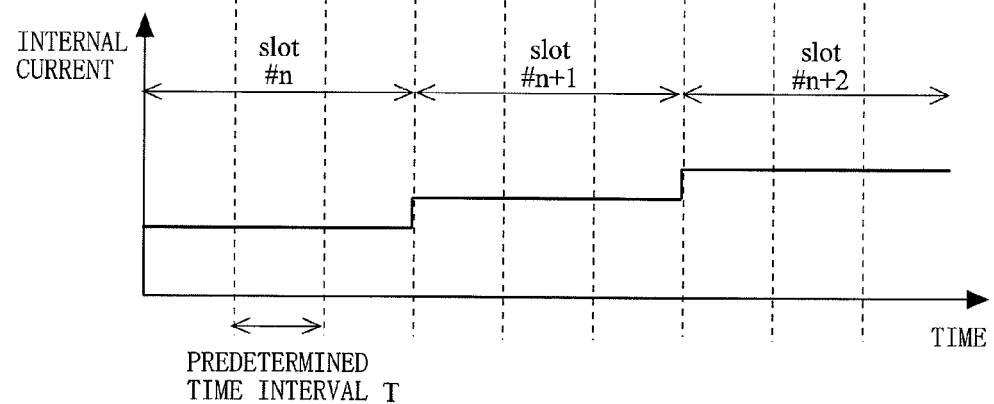
FIG. 10C shows an example of a waveform of an internal current.

A specific manner of controlling the internal current is such that the variable current sources 1101 and 1102 increase the internal current in accordance with an increase of the power information Pc, and decrease the internal current in accordance with a decrease of the power information Pc. In other words, the variable current sources 1101 and 1102 control the internal current such that the internal current has a similar characteristic as that of the power information Pc. FIG. 10C shows an exemplary waveform of the internal current. As shown in FIG. 10C, the internal current has a waveform in which a DC component varies at slot time intervals, similarly to the power information Pc.

The LUT 1105 may store, in advance, a calculation formula for calculating, in accordance with the power information Pc, an optimal value of the internal current to be supplied to the transistors 1103 and 1104. In this case, by assigning the value of the power information Pc to the calculation formula read from the LUT 1105, the variable current sources 1101 and 1102 can calculate the optimal value of the internal current.

As described above, the power supply circuit 31 according to the third embodiment of the present invention is able to, in the case where the power level of the power amplifier 12 is low, improve power efficiency of the entire system and keep a noise generated therein to an acceptable level, by reducing the internal current in accordance with the power information Pc, and in the case where the power level of the power amplifier 12 is high, keep the noise generated therein to an acceptable level without causing deterioration in the power efficiency of the entire system, by increasing the internal current in accordance with the power information Pc. This allows the power supply circuit 31 to operate with low noise and low power consumption.

Described below is a difference in effect between the power supply circuit 31 according to the third embodiment and the power supply circuits according to the first and second embodiments. Since the power supply circuit 31 according to the third embodiment controls the internal current in accordance with the power information Pc shown in FIG. 10B, there is no necessity to have a smoothing circuit, which is a different effect from that of the power supply circuits according to the first and second embodiments. Whereas, an effect of the power supply circuits according to the first and second embodiments is that by setting the predetermined time interval T to be shorter than a slot time, the internal current can be controlled in more detail as compared to the power supply circuit 31 according to the third embodiment.

Note that, the power supply circuit 31 according to the third embodiment of the present invention may have a similar structure to that of the power supply circuit according to the second embodiment, in such a manner as any of power supply circuits 31b to 31e shown in FIGS. 9B to 9E. The power supply circuits 31b to 31e having such a structure are also able to provide the same effect as that of the above-described power supply circuit 31.

Fourth Embodiment

Figure 11A:
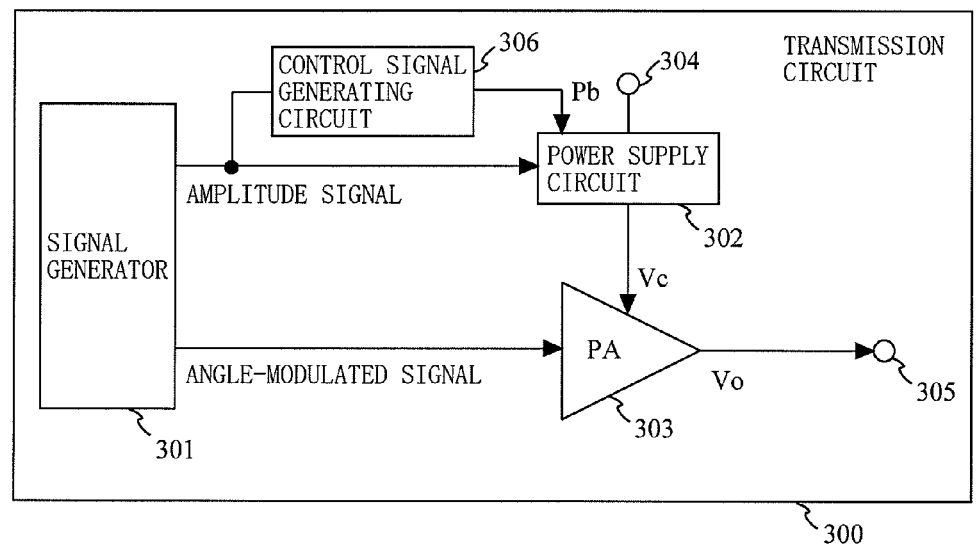
FIG. 11A is a block diagram showing an exemplary structure of a transmission circuit 300 according to a fourth embodiment of the present invention.

FIG. 11A is a block diagram showing an exemplary structure of a transmission circuit 300 according to a fourth embodiment of the present invention. As shown in FIG. 11A, the transmission circuit 300 comprises a signal generator 301, a power supply circuit 302, a power amplifier (PA) 303, a power supply terminal 304, an output terminal 305 and a control signal generating circuit 306. The signal generator 301 generates an amplitude signal and an angle-modulated signal. The amplitude signal is inputted to the power supply circuit 302 and to the control signal generating circuit 306. The control signal generating circuit 306 smoothes the amplitude signal at predetermined time intervals. The smoothed signal is outputted as the internal current control signal Pb for controlling an internal current of the power supply circuit 302. The control signal generating circuit 306 is structured with, e.g., a smoothing circuit.

One of the above-described power supply circuits according to the first and second embodiments is used as the power supply circuit 302. The power supply circuit 302 controls the internal current in accordance with the internal current control signal Pb, and supplies the power amplifier 303 with a voltage which is controlled in accordance with the amplitude signal. The power supply circuit 302 typically supplies the power amplifier 303 with the voltage which is proportional to a magnitude of the amplitude signal. Note that, the power supply circuit 302 is supplied with a DC voltage from the power supply terminal 304. The power amplifier 303 amplifies the angle-modulated signal in accordance with the voltage supplied from the power supply circuit 302, and outputs the amplified signal as a transmission signal.

Figure 11B:
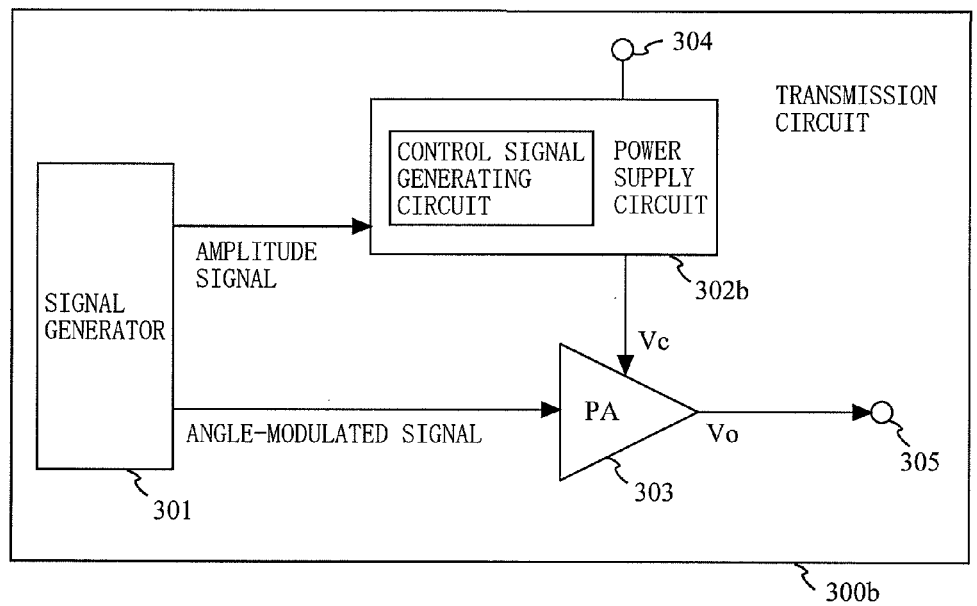
FIG. 11B is a block diagram showing an exemplary structure of a transmission circuit 300b according to the fourth embodiment of the present invention.

Note that, the transmission circuit 300 may have a similar structure to that of a transmission circuit 300b shown in FIG. 11B in which a power supply circuit 302b includes the control signal generating circuit 306.

Figure 11C:
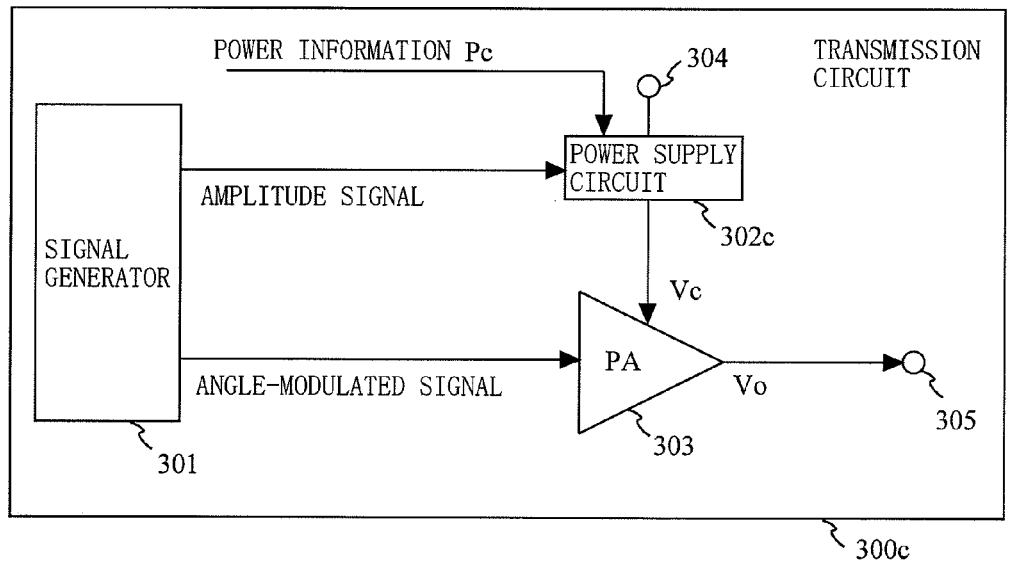
FIG. 11C is a block diagram showing an exemplary structure of a transmission circuit 300c according to the fourth embodiment of the present invention.

Further, the transmission circuit 300 may have a similar structure to that of a transmission circuit 300c shown in FIG. 11C in which the power information Pc is inputted from a baseband to a power supply circuit 302c. In this case, the above-described power supply circuit according to the third embodiment is used as the power supply circuit 302c. The power supply circuit 302c controls an internal current thereof in accordance with the power information Pc, and supplies the power amplifier 303 with a voltage which is controlled in accordance with the amplitude signal.

As described above, the transmission circuits 300 to 300c according to the fourth embodiment of the present invention are each able to operate with low distortion and high efficiency by using, as a power supply circuit, one of the above-described power supply circuits according to the first to third embodiments.

Fifth Embodiment

Figure 12:
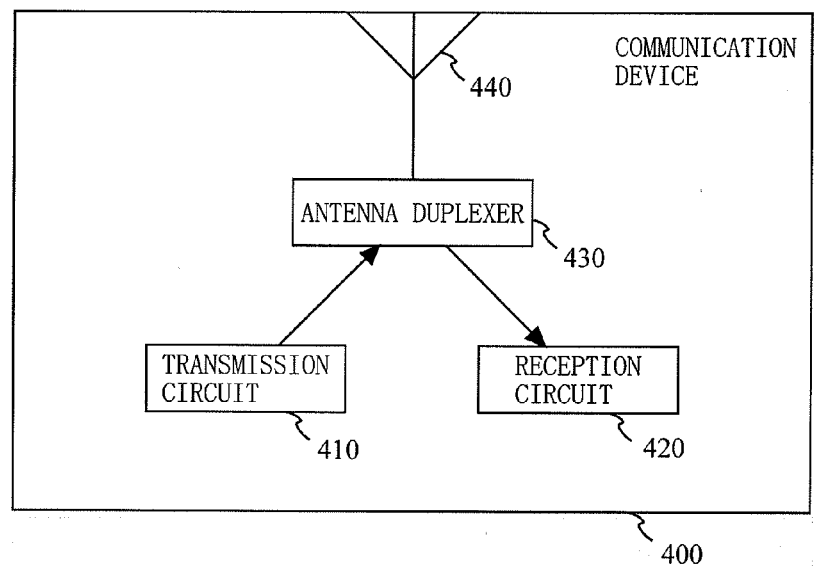
FIG. 12 is a block diagram showing an exemplary structure of a communication device according to a fifth embodiment of the present invention.
Figure 13:
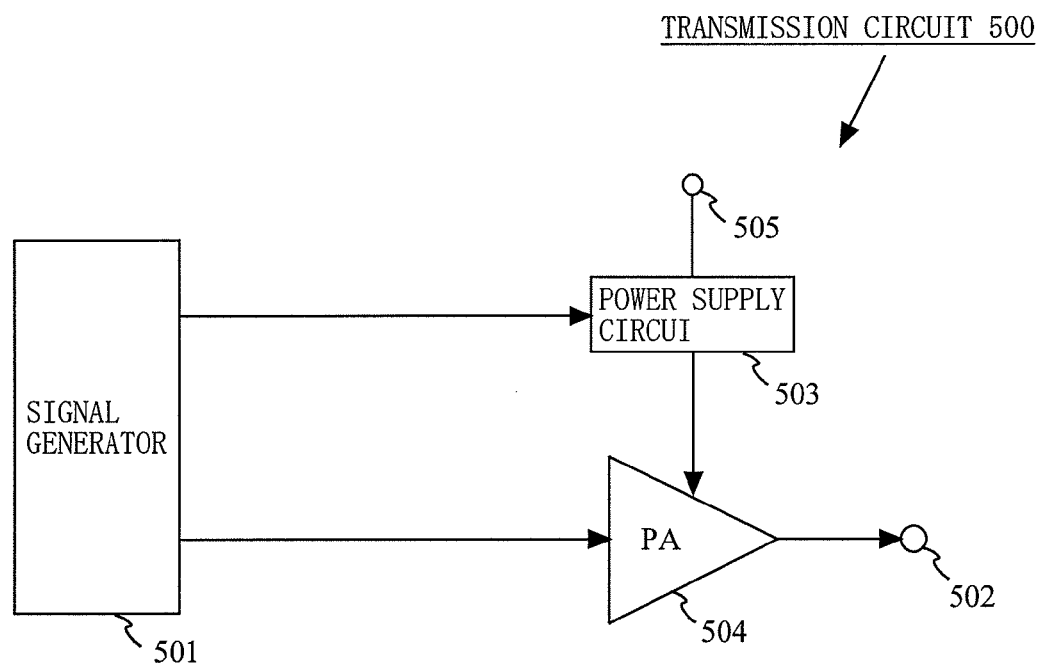
FIG. 13 is a block diagram showing an exemplary structure of a conventional transmission circuit 500.
Figure 14:
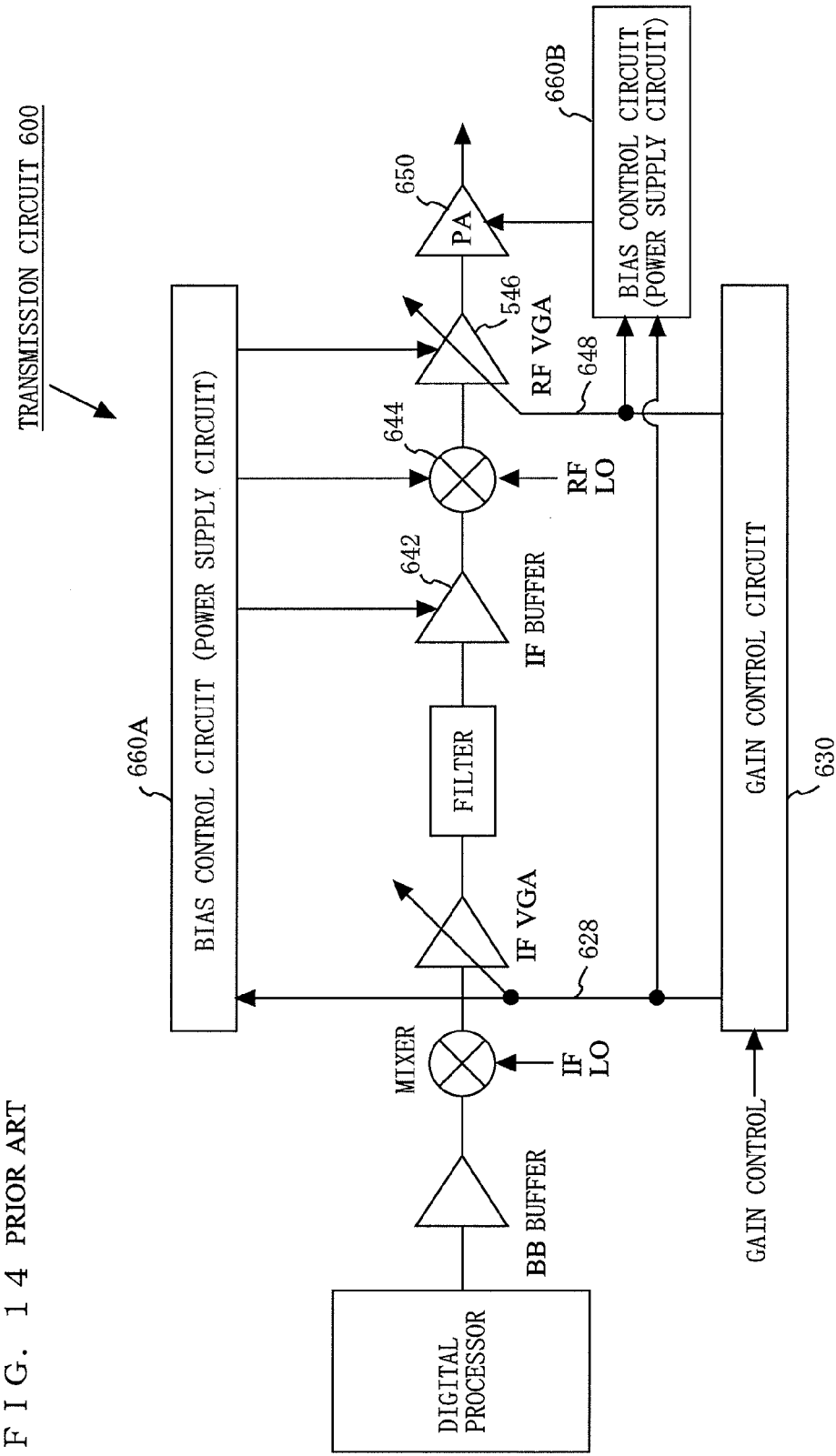
FIG. 14 is a block diagram showing an exemplary structure of a conventional transmission circuit 600.

FIG. 12 is a block diagram showing an exemplary structure of a communication device according to a fifth embodiment of the present invention. As shown in FIG. 12, a communication device 400 according to the fifth embodiment comprises a transmission circuit 410, a reception circuit 420, an antenna duplexer 430 and an antenna 440. The transmission circuit 410 is the transmission circuit 300 described in the above fourth embodiment. The antenna duplexer 430 transmits to the antenna 440 a transmission signal outputted from the transmission circuit 410, and prevents the transmission signal from leaking to the reception circuit 420. Also, the antenna duplexer 430 transmits to the reception circuit 420 a reception signal inputted from the antenna 440, and prevents the reception signal from leaking to the transmission circuit 410.

Accordingly, the transmission signal is outputted from the transmission circuit 410, and released from the antenna 440 to the exterior space via the antenna duplexer 430. The reception signal is received by the antenna 440, and then received by the reception circuit 420 via the antenna duplexer 430. The communication device 400 according to the fifth embodiment uses the transmission circuit 300 according to the fourth embodiment, thereby securing linearity of the transmission signal and also realizing low distortion as a radio device. Since there is no branching element, such as a directional coupler, on an output of the transmission circuit 410, loss from the transmission circuit 410 to the antenna 440 is reduced, whereby power consumption at the time of transmission is reduced. As a result, the communication device 400 is able to operate for a long period of time as a radio communication device. Note that, the communication device 400 may have a structure which includes only the transmission circuit 410 and the antenna 440.

The power supply circuits according to the present invention are each applicable as, e.g., a power supply circuit for supplying a voltage to a power amplifier used in mobile phones, wireless LAN devices or the like.

While the invention has been described in detail, the foregoing description is in all aspects illustrative and not restrictive. It is understood that numerous other modifications and variations can be devised without departing from the scope of the invention.

What is claimed is:

1. A power supply circuit for supplying a voltage to a power amplifier, comprising:

an operational amplifier for amplifying a power level control signal which controls a power level of the power amplifier and controlling in accordance with the power level of the power amplifier, an internal current of the operational amplifier at a time of amplifying the power level control signal; and a power transistor for amplifying an output signal of the operational amplifier, and supplying the power amplifier with a voltage, wherein an internal current control signal which indicates the power level of the power amplifier is inputted to the operational amplifier, and the internal current is controlled in accordance with the inputted internal current control signal, wherein the operational amplifier includes:
- two transistors for amplifying the power level control signal; and
- two variable current sources for supplying an internal current to the two transistors, and wherein when the internal current control signal increases in magnitude, the two variable current sources increase the internal current to be supplied to the two transistors, and when the internal current control signal decreases in magnitude, the two variable current sources decrease the internal current to be supplied to the two transistors.

2. The power supply circuit according to claim 1,
wherein the operational amplifier further includes a comparing circuit for comparing the internal current control signal with a predetermined threshold value, and
wherein the variable current sources each have:
- a first transistor connected to a reference current source;
- a switch whose on/off state is controlled by the comparing circuit; and
- a second transistor connected to the reference current source via the switch, and wherein when the internal current control signal is equal to or greater than the predetermined threshold value, the comparing circuit turns on the switch, and when the internal current control signal is smaller than the predetermined threshold value, the comparing circuit turns off the switch.

3. The power supply circuit according to claim 1,
wherein the operational amplifier further comprises n comparing circuits each for comparing the internal current control signal with a predetermined threshold value,
wherein the variable current sources each include:
- n switches whose on/off states are controlled by the n comparing circuits, respectively; and
- n transistors which are connected to a reference current source via the n switches, respectively, and wherein the n comparing circuits respectively have n threshold values in ascending order, and when the internal current control signal is equal to or greater than a threshold value k and smaller than a threshold value k+1, 1st to kth switches among the n switches are turned on, and k+1th to nth switches are turned off.

4. A power supply circuit for supplying a voltage to a power amplifier, comprising:
an operational amplifier for amplifying a power level control signal which controls a power level of the power amplifier, and controlling, in accordance with the power level of the power amplifier, an internal current of the operational amplifier at a time of amplifying the power level control signal; and
a power transistor for amplifying an output signal of the operational amplifier, and supplying the power amplifier with a voltage, wherein an internal current control signal which indicates the power level of the power amplifier is inputted to the operational amplifier, and the internal current is controlled in accordance with the inputted internal current control signal, wherein the operational amplifier reads, in accordance with the internal current control signal, information about the internal current of the operational amplifier, the information being stored in advance in a lookup table and corresponding to the power level of the power amplifier, wherein the operational amplifier controls the internal current at the time of amplifying the power level control signal, wherein the operational amplifier includes:
- a control circuit for reading information about the internal current of the operational amplifier from the lookup table, in accordance with the internal current control signal;
- two transistors for amplifying the power level control signal; and
- two variable current sources for supplying the internal current to the two transistors, wherein the two variable current sources each have:
- a first transistor connected to a reference current source;
- a switch whose on/off state is controlled by the control circuit; and
- a second transistor connected to the reference current source via the switch, and wherein the control circuit controls the on/off state of the switch in accordance with the information, read from the lookup table, about the internal current of the operational amplifier.

5. A power supply circuit for supplying a voltage to a power amplifier, comprising:
an operational amplifier for amplifying a power level control signal which controls a power level of the power amplifier and controlling in accordance with the power level of the power amplifier, an internal current of the operational amplifier at a time of amplifying the power level control signal; and
a power transistor for amplifying an output signal of the operational amplifier, and supplying the power amplifier with a voltage, wherein an internal current control signal which indicates the power level of the power amplifier is inputted to the operational amplifier, and the internal current is controlled in accordance with the inputted internal current control signal, wherein the operational amplifier reads, in accordance with the internal current control signal, information about the internal current of the operational amplifier, the information being stored in advance in a lookup table and corresponding to the power level of the power amplifier, wherein the operational amplifier controls the internal current at the time of amplifying the power level control signal, wherein the operational amplifier includes:
- a control circuit for reading the information about the internal current of the operational amplifier from the lookup table, in accordance with the internal current control signal;
- n switches whose on/off states are controlled by the control circuit; and
- n transistors which are connected to a reference current source via the n switches, respectively, and wherein the control circuit controls the on/off states of the n switches in accordance with the information, read from the lookup table, about the internal current of the operational amplifier.

* * * * *